United States Patent [19]
Ferdinandsen

[11] Patent Number: 6,084,920
[45] Date of Patent: Jul. 4, 2000

[54] DIODE DETECTOR

[75] Inventor: Svend Ferdinandsen, Vallensbaek Strand, Denmark

[73] Assignee: Nokia Mobile Phones Limited, Espoo, Finland

[21] Appl. No.: 08/941,589

[22] Filed: Sep. 30, 1997

[30] Foreign Application Priority Data

Oct. 1, 1996 [GB] United Kingdom .................. 9620446

[51] Int. Cl.[7] .................................................. H04K 1/02
[52] U.S. Cl. .......................... 375/297; 330/140; 455/126
[58] Field of Search .................................. 375/295, 296, 375/297; 330/140, 129; 455/126

[56] References Cited

U.S. PATENT DOCUMENTS

| | | | |
|---|---|---|---|
| 4,523,155 | 6/1985 | Walczak et al. | 330/279 |
| 4,754,231 | 6/1988 | Sawa | 330/279 |
| 5,043,672 | 8/1991 | Youn | 330/129 |
| 5,113,336 | 5/1992 | Takahashi et al. | 363/61 |
| 5,196,806 | 3/1993 | Ichihara | 330/137 |
| 5,304,948 | 4/1994 | Mucke | 330/284 |
| 5,307,026 | 4/1994 | Mucke | 330/283 |
| 5,509,011 | 4/1996 | Birth | 370/498 |
| 5,566,201 | 10/1996 | Ostman | 375/200 |
| 5,732,332 | 3/1998 | Iida | 455/117 |
| 5,796,309 | 8/1998 | Ngyuen | 330/289 |
| 5,854,971 | 12/1998 | Nagoya et al. | 455/126 |

FOREIGN PATENT DOCUMENTS

| | | |
|---|---|---|
| 0291345 A2 | 11/1988 | European Pat. Off. . |
| 0523718 A2 | 1/1993 | European Pat. Off. . |
| 0611100 A1 | 8/1994 | European Pat. Off. . |
| 1167080 | 10/1969 | United Kingdom . |

*Primary Examiner*—Stephen Chin
*Assistant Examiner*—Lenny Jiang
*Attorney, Agent, or Firm*—Perman & Green, LLP

[57] ABSTRACT

The diode detector for detecting an RF signal has an input on which the RF signal is received, and an output on which a DC signal corresponding to the RF signal is emitted. The diode detector comprises a detector diode, a compensator diode, and a voltage divider configuration which, in addition to the detector diode and the compensator diode, comprises two resistors, and which form part of a DC path across which a DC bias, $V_{batt}$, is applied. The input and output of the diode detector are connected to respective terminals of the detector diode in said DC path. A discharge capacitor ensures that the compensator diode does not receive the RF signal.

11 Claims, 4 Drawing Sheets

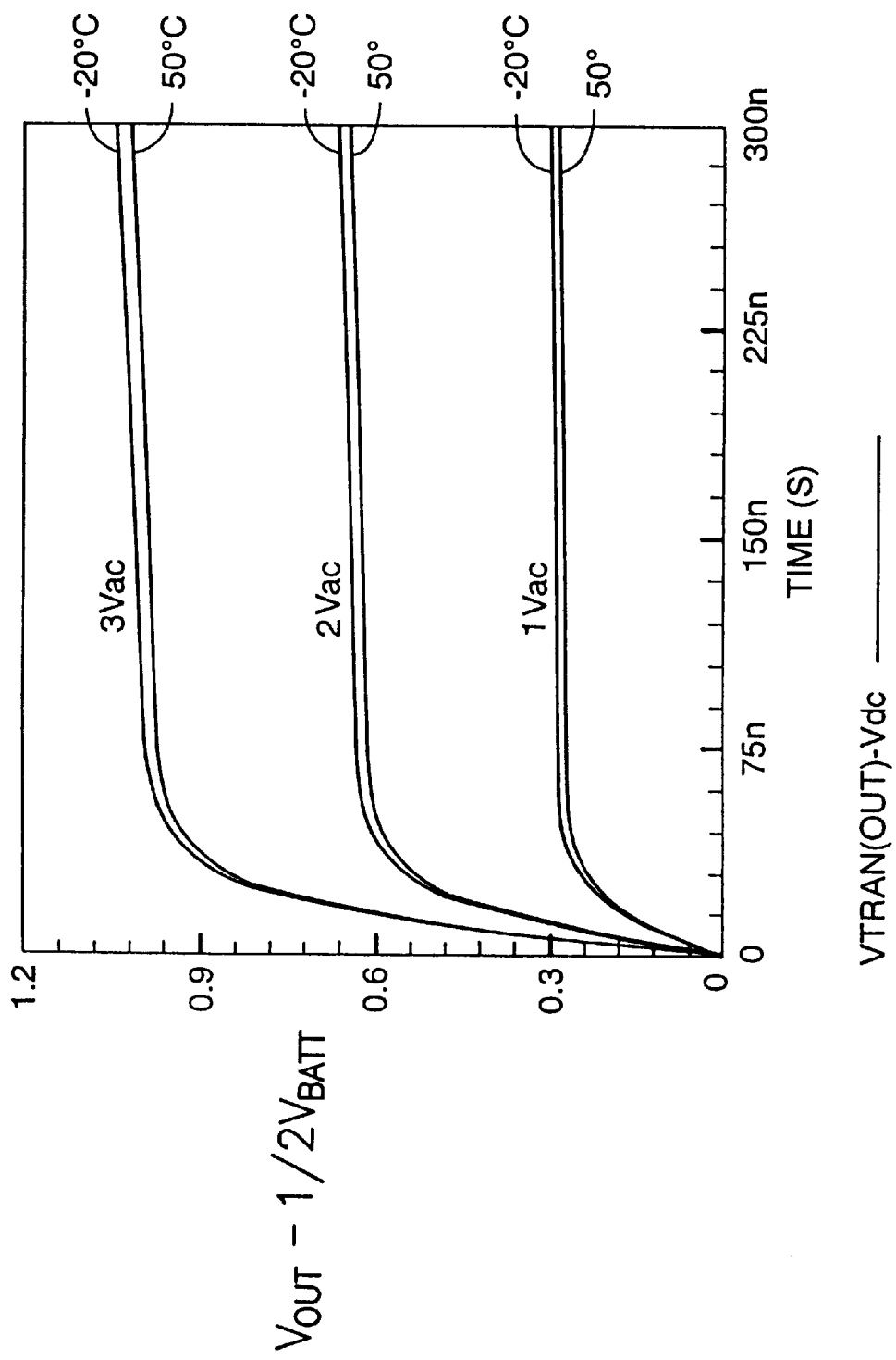

DIODE DETECTOR

BACKGROUND OF THE INVENTION

The invention concerns a regulator loop having temperature compensated diode detector to detect an RF signal and a radio telephone having such a regulator loop having temperature compensated diode detector in its transmitter output stage.

Regulator loops having temperature compensated diode detectors of this type are used e.g. in connection with radio telephones, where the output signal from the power amplifier (PA stage) is monitored to ensure correct transmission power. Temperature compensated detectors are frequently used for this purpose, as the response of the detector will otherwise vary with the temperature. This is particularly so with portable radio telephones, as these are frequently carried in environments of great temperature fluctuations, without the telephone being expected to respond to this.

U.S. Pat. No. 4,523,155 discloses a temperature compensated diode detector, where a detector diode is incorporated in a half-wave rectifier. The compensator diode has a double function, as it partly compensates for the temperature dependence of the detector diode, and partly forms part of a bias circuit, whereby the voltage on the detector diode input is raised to a value corresponding to the voltage drop across the detector diode when it is conductive. The voltage on the detector diode output corresponds to the RF signal when it is positive, and otherwise assumes the value zero.

SUMMARY OF THE INVENTION

In accordance with the invention there is provided a regulator loop for controlling the RF output power from a power amplifier of a radio phone, said regulator loop comprises a diode detector for detecting an RF signal from said power amplifier and for providing an output signal in response hereto, a controlling circuit for generating a control signal for the power amplifier in dependence of the output signal from said detector and a reference signal representing the desired output power of the power amplifier. The said diode detector comprises a voltage divider configuration which forms part of a DC path across which a DC bias is applied, said voltage divider configuration comprises two resistors and a detector diode and a compensator diode, and the input and the output of the detector being connected to respective terminals of the detector diode in said DC path, and said controlling circuit combines the output signal from said detector and the reference signal for providing the control signal for the power amplifier.

The invention provides a regulator loop having temperature compensated diode detector wherein the output signal from the detector can easily be used for control purposes.

Particularly in case of the low supply voltages, it is an advantage that the detector signal is at a level around one-half of the supply voltage and may be polarized negatively, thereby allowing summing of it with the control voltage to avoid large common mode changes in the loop amplifier. This provides great freedom in the design of the active circuits to control the power from the PA unit.

The invention furthermore relates to a diode detector for detecting an RF signal on an input and for emitting an output signal in response thereto, comprising a detector diode, a compensator diode, and a voltage divider configuration which forms part of a DC path across which a DC bias is applied, said voltage divider configuration comprises two resistors and a detector diode and a compensator diode, and the input and the output of the detector being connected to respective terminals of the detector diode in said DC path.

BRIEF DESCRIPTION OF THE DRAWINGS

The invention will be explained more fully below in connection with a preferred embodiment and with reference to the drawing, in which:

FIG. 6 shows the output signal of the diode detector as a function of time at various input voltages and temperatures.

DETAILED DESCRIPTION OF THE INVENTION

A temperature compensated diode detector according to the invention may e.g. be implemented in a portable radio telephone used in the GSM system. A GSM radio telephone communicates with an associated base station in the frequency bands 890–915 MHz (up link) and 935–960 MHz (down link). Each frequency band is divided into 124 channels (TDMA) with a separation of 200 kHz.

The temperature compensated diode detector, which forms the subject-matter of the invention, is used in its preferred embodiment in a regulation loop of a power amplifier (PA) in a GSM telephone. Although the invention will explained in connection with this specific application, the invention may be applied in other connections where it is desired to measure the size of an RF signal.

Figure 1:
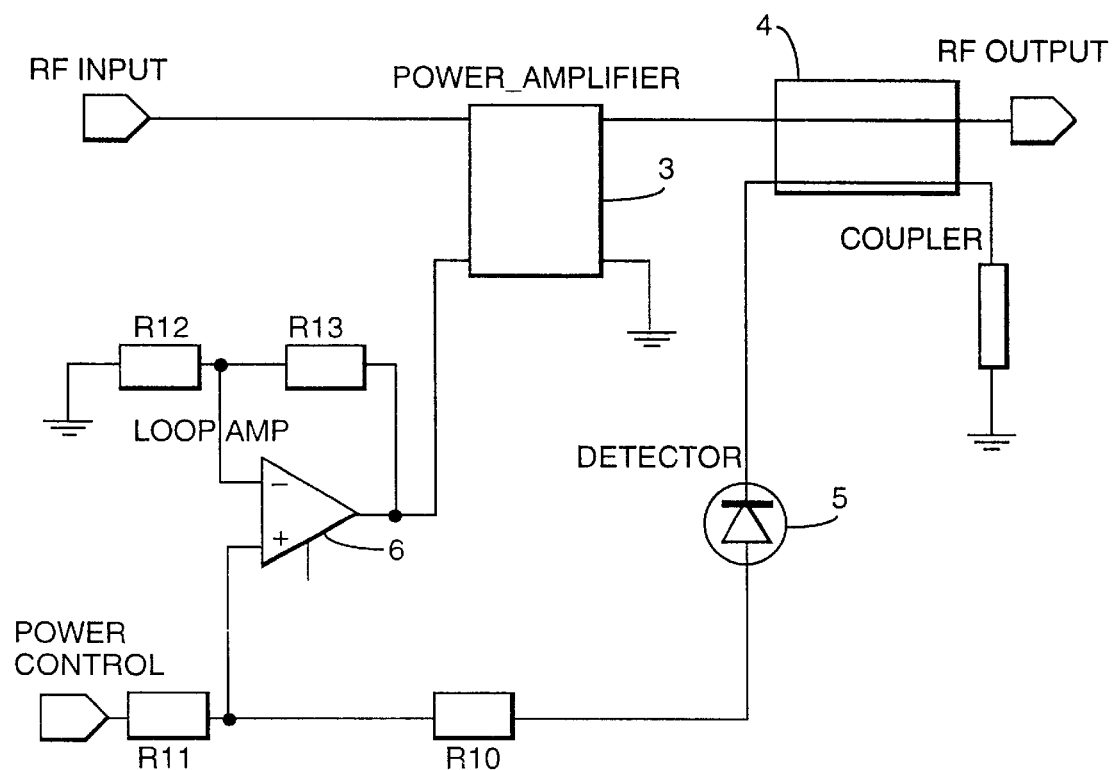
FIG. 1 schematically shows a portion of a GSM telephone transmitter part to illustrate a use of a preferred embodiment of regulator loop with a temperature compensated diode detector according to the invention.

A portion of a GSM telephone transmitter part is shown in FIG. 1. An RF signal having a channel frequency in the 890–915 MHz band is received from the mixer (not shown) of the telephone. The RF signal is then fed to a PA stage 3, in which the signal is amplified to achieve the desired transmission power (up to 2 W for a power class 4 telephone) and is then emitted to the antenna (not shown).

A directional coupler 4 arranged after the PA stage 3 generates a loop signal via an inductive coupling, said loop signal representing the output signal of the PA stage 3. According to the invention, the loop signal is fed to a temperature compensated detector shown here schematically as a single diode 5, where a DC output signal is generated in response to the RF signal on the input. The output signal from the detector and the control signal Power Control is summed up by the two resistors $R_{10}$ and $R_{11}$, thereby generating an error signal which is amplified and which controls the gain in the PA. The output power may hereby be controlled by means of the Power Control signal.

The center of the voltage divider $R_{10}$, $R_{11}$ is coupled to the +input on a comparator 6. The output of the comparator 6 is fed back to the –input via a third resistor $R_{13}$ and from there to ground via a fourth resistor $R_{12}$. Since the voltage on the +input of the comparator 6 also occurs on the –input, the resistors $R_{12}$ and $R_{13}$ will conduct a current to control/regulate the output signal of the PA stage 3 toward the desired power.

Figure 2:
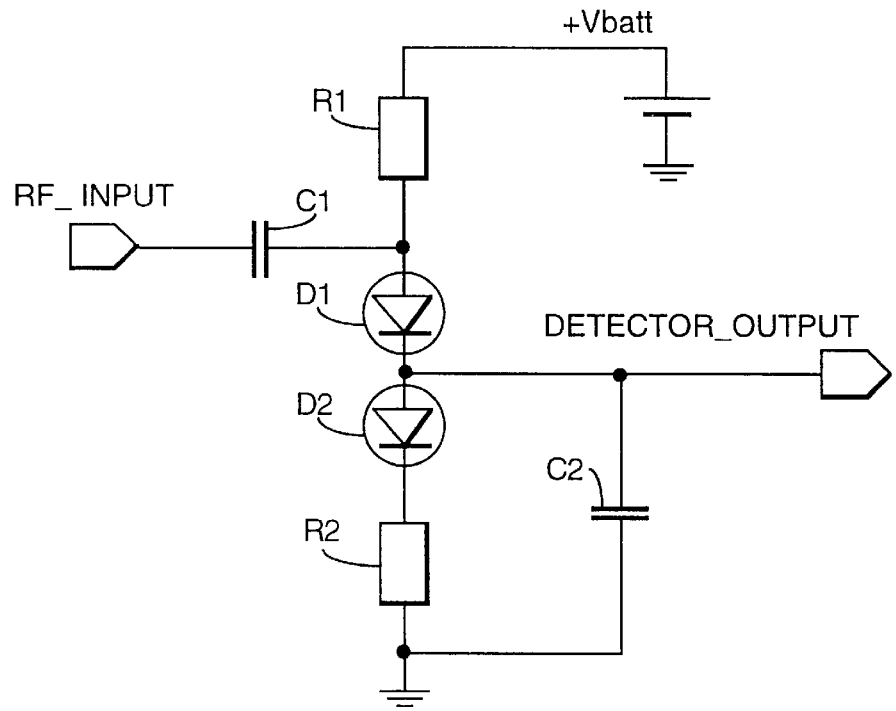
FIG. 2 shows the preferred embodiment of a temperature compensated diode detector according to the invention.

A preferred embodiment of the temperature compensated diode detector itself is shown in FIG. 2. The diode detector comprises a voltage divider between a DC voltage source $V_{batt}$ and ground. The voltage divider comprises two resistors $R_1$ and $R_2$, which are usually identical. The resistors are arranged in series with two diodes $D_1$ and $D_2$, where $D_1$ serves as a detector diode in case of positive RF sensitivity, while $D_2$ serves as a compensating diode. The expression "positive RF sensitivity" means that the DC voltage on the detector output changes positively when the RF signal on the input increases. Since the diodes $D_1$ and $D_2$ are identical, the compensator diode $D_2$ will greatly compensate for the temperature dependence which the detector diode $D_1$ has. With the couplings shown as preferred embodiments, the compensation may be regarded as being complete in practice with respect to the detector DC output. If it is desired to introduce a specific temperature dependence in the detector, this dependence may be controlled by changing the ratio of the resistor $R_1$ to the resistor $R_2$.

The RF signal is received on the detector input, where it passes a capacitor $C_1$ which prevents the DC current from returning to the input from the DC path formed by the voltage divider. A DC bias, $V_{BAT}$, is applied to the voltage divider, and this bias generates a DC current through the voltage divider $R_1$ and $R_2$ and the diodes $D_1$ and $D_2$ and thus biases the detector diode $D_1$. The DC current through the detector diode is superposed by the AC signal received on the input (the RF signal), which results in a change in the average voltage across the diode because of the non-linear characteristic of the diodes.

It is noted that the input and output of the diode detector are coupled to their respective ones of the detector diode terminals. Both the compensator diode and the detector diode conduct in the current direction of the DC path. The detection generates a voltage which is superposed by the DC voltage, which is present when there is no RF signal. The AC content is removed by the decoupling capacitor $C_2$, partly to make the detector apply a pure DC voltage level on the output, partly to ensure that the compensator diode $D_2$ does not detect anything of the RF signal.

It is noted that the bias $V_{batt}$ must be positive, and that the ratio of the output signal $V_{OUT}$ to the RF signal will be positive for the configuration shown in FIG. 2. If it is desired with a positive bias that the ratio of the output voltage $V_{OUT}$ to the RF signal is negative, the configuration shown in FIG. 4 may be used instead, wherein the AC current and the DC current through the diode $D_2$, which now serves as a detector diode, are oppositely directed.

Figure 3:
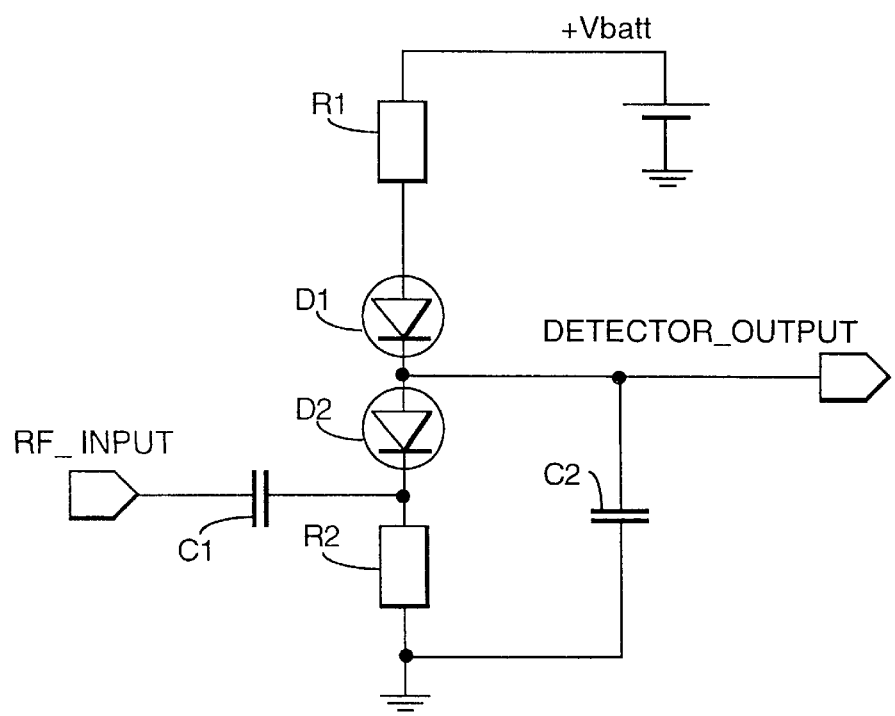
FIGS. 3–5 show alternative embodiments of temperature compensated diode detectors according to the invention.
Figure 5:
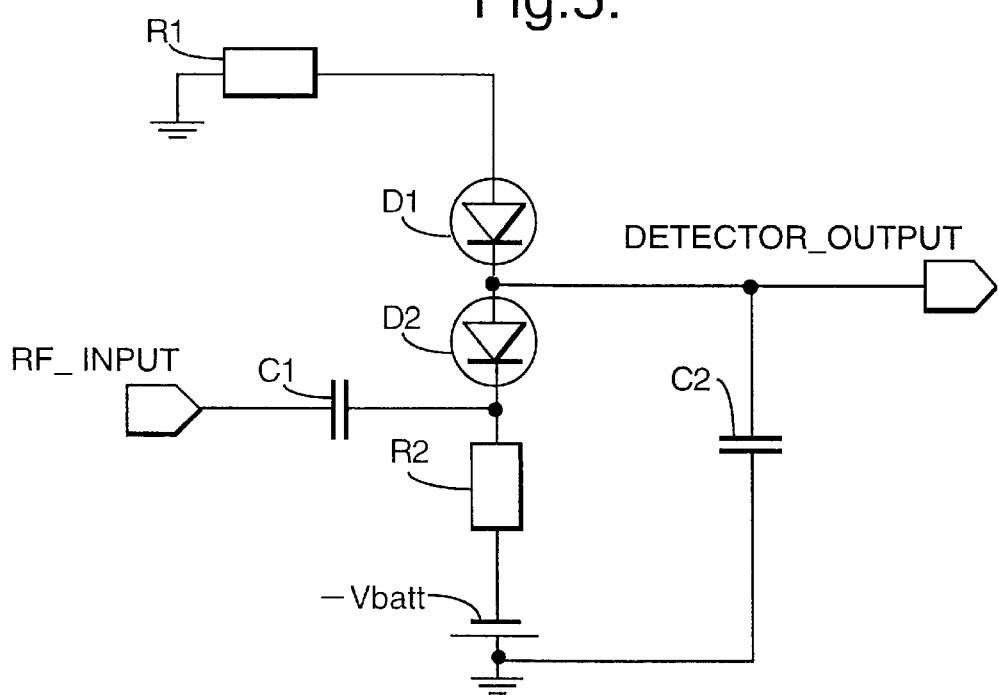

If the bias $V_{batt}$ is negative, the diodes $D_1$ and $D_2$ are inverted, so that they now conduct from ground to $V_{batt}$. If the ratio of the output voltage $V_{OUT}$ to the RF signal is to be positive, the configuration shown in FIG. 3 must be used, wherein the AC current and the DC current through the diode $D_1$, which serves as a detector diode, are directed in the same direction. If the ratio of the output voltage $V_{OUT}$ to the RF signal is to be negative, the configuration shown in FIG. 5 must be used, wherein the AC current and the DC current through the diode $D_2$, which serves as a detector diode, are oppositely directed.

Figure 4:
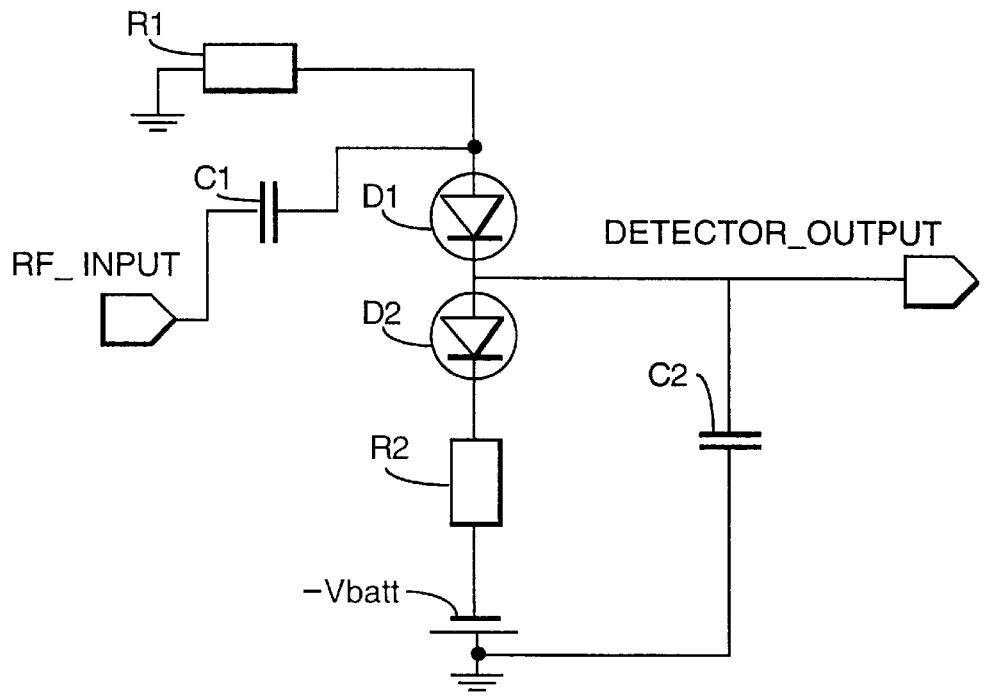

For positive and negative supply voltage, respectively, the detectors shown in FIGS. 2 and 4 will have a positive change of the output voltage when the RF input increases. For positive and negative supply voltage, respectively, the detectors shown in FIGS. 3 and 5 will have a negative change of the output voltage when the RF input increases. The best temperature compensation of the output signal is achieved with identical resistors $R_1$ and $R_2$ and diodes $D_1$ and $D_2$. Typical values of a detector for a GSM telephone are resistance values of about 10 k$\Omega$ and capacitor values of about 27 pF. The supply voltage $V_{batt}$ may advantageously be about 5 V, so that the bias current will be about 0.2 mA. Other voltages, frequencies and bandwidths can be achieved by suitable scaling.

The essential feature of the circuit is that the compensation is achieved by coupling the diodes in series with respect to the bias current, which gives a stable DC level of $V_{batt}/2$ when the RF signal is zero.

It has been achieved by the invention that the detector and the temperature compensation function even though the detector output is loaded.

FIG. 6 illustrates the transient of the output voltage from the diode detector of FIG. 2 as a function of time and at −20° C. and at 50° C. The horizontal axis shows the time, while the vertical axis shows the detector output voltage minus half the supply voltage, $V_{batt}$. Three curves of three RF input voltages of 1, 2 and 3 V are shown. It will be seen that the temperature drift is a pure change in the sensitivity of less than about 0.5 dB from −20° C. to +50° C.

The diodes will typically have a temperature dependence of the order of 2.5 mV/° C., which is rather much when it is desired to detect RF signals having an AC amplitude of as low as 5–10 mV. The resistors forming part of the voltage divider of the diode detector will typically be of the order of 1–100 k$\Omega$, preferably from 1–10 k$\Omega$.

Adaptation of the resistors to $V_{BAT}$ makes it possible to achieve the desired bias current, which is selected optimally with respect to sensitivity and response time. Typical bias currents are from 10 $\mu$A–1 mA, preferably from 20 $\mu$A to 200 $\mu$A.

Four important aspects of the diode detector are:
1. The DC drift depends solely on the uniformity of the diodes.
2. The properties of the detector are not changed by a moderate load on the output.
3. The output signal, in terms of DC, is arranged on half the supply voltage in the preferred embodiment.
4. Positive and negative response may be selected arbitrarily, as required.

What is claimed is:

1. A regulator loop for controlling the RF output power from a power amplifier of a radio phone, said regulator loop comprises:

a diode detector for detecting an RF signal from said power amplifier and for providing an output signal in response thereto;

a controlling circuit for generating a control signal for the power amplifier in dependence of the output signal from said detector and a reference signal representing the desired output power of the power amplifier;

said diode detector comprises a voltage divider configuration which forms part of a DC path across which a DC bias is applied, said voltage divider configuration comprises two resistors and a detector diode and a compensator diode, and the input and the output of the diode detector being connected to respective terminals of the detector diode in said DC path; and said controlling circuit combines the output signal from said detector and the reference signal for providing the control signal for the power amplifier; and wherein said controlling circuit provides a moderate load on the output of the detector ensuring that the output signal from the diode detector, in terms of DC, does not exceed half the DC bias applied to the diode detector.

2. A regulator loop according to claim 1, wherein the controlling circuit sums the output signal from said detector and the reference signal for providing the control signal for the power amplifier.

3. A regulator loop according to claim 1 wherein the controlling circuit sums the output signal from the detector and the reference signal for providing the control signal for the power amplifier, by an operational amplifier having a plus-terminal coupled to the center of the voltage divider configuration receiving the output signal from said detector and the reference signal respectively.

4. A regulator loop according to claim 3, wherein the gain of the operational amplifier is controlled by a negative feed back loop of the operational amplifier.

5. A regulator loop according to claim 1, wherein the compensator diode and a discharge capacitor are connected in parallel to ground.

6. A regulator loop according to claim 1, wherein the RF signal passes through both the compensator diode and the detector diode.

7. A radio telephone with a transmitter output stage having a regulator loop according to claim 1.

8. A diode detector for detecting an RF signal on an input and for emitting an output signal in response thereto, comprising a detector diode, a compensator diode, and a voltage divider configuration which forms part of a DC path across which a DC bias is applied, said voltage divider configuration comprises two resistors and the detector diode and the compensator diode, and the input and the output of the diode detector being connected to the respective terminals of the detector diode in said DC path, the output of the diode detector being connected to a moderate load ensuring that the output signal from the diode detector, in terms of DC, does not exceed half the DC bias applied to the diode detector.

9. A diode detector according to claim 8, wherein the compensator diode and a discharge capacitor are connected in parallel to ground.

10. A diode detector according to claim 8, wherein each of the resistances in the DC path is of the order of 1–100 k$\Omega$; and the DC current in the DC path is of the order of 10 $\mu$A–1 mA.

11. A method of using a diode detector circuit to detect an RF signal on an input and to emit an output signal in response thereto comprising the steps of:

providing a detector diode and a compensator diode;

forming a voltage divider with the detector diode, the compensator diode, a first resistor and a second resistor, to form part of a DC path across which a DC bias is applied;

connecting an input and an output of the diode detector circuit to respective terminals of the detector diode in the DC path; and connecting the diode detector circuit to a moderate load to ensure that the output signal from the diode detector circuit, in terms of DC, does not exceed half a DC bias applied to the diode detector circuit.

* * * * *